(12) United States Patent
Suzuki et al.

(10) Patent No.: US 7,691,765 B2
(45) Date of Patent: Apr. 6, 2010

(54) TRANSLUCENT MATERIAL AND MANUFACTURING METHOD OF THE SAME

(75) Inventors: Masayuki Suzuki, Kanagawa-ken (JP); Tomotake Ikada, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 392 days.

(21) Appl. No.: 11/662,251

(22) PCT Filed: Mar. 29, 2006

(86) PCT No.: PCT/JP2006/306492

§ 371 (c)(1),
(2), (4) Date: Mar. 9, 2007

(87) PCT Pub. No.: WO2006/106745

PCT Pub. Date: Oct. 12, 2006

(65) Prior Publication Data

US 2009/0081100 A1    Mar. 26, 2009

(30) Foreign Application Priority Data

Mar. 31, 2005    (JP) .............................. 2005-104615

(51) Int. Cl.
*C04B 35/50* (2006.01)
*C04B 35/51* (2006.01)
*C04B 35/00* (2006.01)
*B29C 67/00* (2006.01)
*H05B 6/00* (2006.01)

(52) U.S. Cl. .................. 501/152; 501/153; 264/125; 264/434; 423/263

(58) Field of Classification Search .............. 501/152, 501/153; 423/263; 264/681, 434, 125
See application file for complete search history.

(56) References Cited

U.S. PATENT DOCUMENTS 5,037,577 A * 8/1991 Yamanoi et al. ...... 252/301.4 R (Continued)

FOREIGN PATENT DOCUMENTS

EP    1 162 705 A2    12/2001

(Continued)

OTHER PUBLICATIONS

Mill, B.V., "Hydrothermal Synthesis of Aluminum and Gallium Garnets," Soviet Physics-Crystallography, (*Kristallografiya*), vol. 12, No. 1, pp. 137-139, 1967.

(Continued)

*Primary Examiner*—Karl E Group
*Assistant Examiner*—Noah S Wiese
(74) *Attorney, Agent, or Firm*—Sughrue Mion, PLLC

(57) ABSTRACT

After synthesizing particles by liquid phase synthesis, the solution is substituted without drying these particles, and here, a solution comprising a grain boundary phase composition consisting of at least one or more types selected from a group consisting of $Al_2O_3$, yttrium oxide, silicon oxide, yttrium-silicon complex oxide, aluminum-silicon complex oxide, and a compound having a garnet structure with a lower melting point than the aforementioned particles, or a solution comprising a precipitate is introduced. Microparticles are adjusted by allowing adhesion and growth of the solution comprising a composition of grain boundary phase or the solution comprising a precipitate on the surface of the particles; these microparticles are allowed to align in 3-dimensions in solution and are formed into a molded body, and this molded body is sintered.

20 Claims, 4 Drawing Sheets

U.S. PATENT DOCUMENTS

| | | | |
|---|---|---|---|
| 5,070,507 A | | 12/1991 | Anthon |
| 5,484,750 A | * | 1/1996 | Greskovich et al. ............ 501/86 |
| 5,893,999 A | | 4/1999 | Tamatani et al. |
| 5,961,943 A | * | 10/1999 | Komatsu et al. ......... 423/328.2 |
| 6,200,918 B1 | | 3/2001 | Yanagitani et al. |
| 6,447,937 B1 | * | 9/2002 | Murakawa et al. .......... 428/696 |
| 6,642,652 B2 | | 11/2003 | Collins, III et al. |
| 6,764,183 B2 | | 7/2004 | Okazaki |
| 6,825,144 B2 | | 11/2004 | Hideki et al. |
| 2003/0214986 A1 | | 11/2003 | Kouta et al. |
| 2004/0135295 A1 | * | 7/2004 | Niimi ......................... 264/656 |
| 2004/0145308 A1 | | 7/2004 | Rossner et al. |

FOREIGN PATENT DOCUMENTS

| | | |
|---|---|---|
| JP | 62-108735 A | 5/1987 |
| JP | 10-101411 A | 4/1988 |
| JP | 1-093404 A | 4/1989 |
| JP | 2-092817 A | 4/1990 |
| JP | 2-133386 A | 5/1990 |
| JP | 2-283663 A | 11/1990 |
| JP | 3-159917 A | 7/1991 |
| JP | 3-207787 A | 9/1991 |
| JP | 3-218963 A | 9/1991 |
| JP | 3-275561 A | 12/1991 |
| JP | 4-055363 A | 2/1992 |
| JP | 5-090693 A | 4/1993 |
| JP | 5-139862 A | 6/1993 |
| JP | 5-175591 A | 7/1993 |
| JP | 5-235462 A | 9/1993 |
| JP | 5-286761 A | 11/1993 |
| JP | 5-286762 A | 11/1993 |
| JP | 5-294709 A | 11/1993 |
| JP | 5-294722 A | 11/1993 |
| JP | 5-294723 A | 11/1993 |
| JP | 5-294724 A | 11/1993 |
| JP | 5-301769 A | 11/1993 |
| JP | 5-301770 A | 11/1993 |
| JP | 5-330912 A | 12/1993 |
| JP | 5-330913 A | 12/1993 |
| JP | 5-331461 A | 12/1993 |
| JP | 5-331462 A | 12/1993 |
| JP | 5-335678 A | 12/1993 |
| JP | 6-33051 A | 2/1994 |
| JP | 6-41526 A | 2/1994 |
| JP | 6-107456 A | 4/1994 |
| JP | 6-122551 A | 5/1994 |
| JP | 6-144925 A | 5/1994 |
| JP | 6-211563 A | 8/1994 |
| JP | 6-211573 A | 8/1994 |
| JP | 7-082025 A | 3/1995 |
| JP | 7-114342 A | 5/1995 |
| JP | 7-315992 A | 12/1995 |
| JP | 8-12498 A | 1/1996 |
| JP | 8-059397 A | 3/1996 |
| JP | 8-183613 A | 7/1996 |
| JP | 8-203119 A | 8/1996 |
| JP | 8-264155 A | 10/1996 |
| JP | 8-268751 A | 10/1996 |
| JP | 8-298099 A | 11/1996 |
| JP | 8-322926 A | 12/1996 |
| JP | 8-325054 A | 12/1996 |
| JP | 8-327845 A | 12/1996 |
| JP | 9-045287 A | 2/1997 |
| JP | 9-110420 A | 4/1997 |
| JP | 9-291279 A | 11/1997 |
| JP | 9-293774 A | 11/1997 |
| JP | 9-315865 A | 12/1997 |
| JP | 9-320524 A | 12/1997 |
| JP | 10-064481 A | 3/1998 |
| JP | 10-067555 A | 3/1998 |
| JP | 10-101333 A | 4/1998 |
| JP | 10-101334 A | 4/1998 |
| JP | 10-114519 A | 5/1998 |
| JP | 10-162776 A | 6/1998 |
| JP | 10-236871 A | 9/1998 |
| JP | 10-242513 A | 9/1998 |
| JP | 10-273364 A | 10/1998 |
| JP | 11-017266 A | 1/1999 |
| JP | 11-130428 A | 5/1999 |
| JP | 11-147757 A | 6/1999 |
| JP | 11-157933 A | 6/1999 |
| JP | 11-189413 A | 7/1999 |
| JP | 11-243232 A | 9/1999 |
| JP | 11-278933 A | 10/1999 |
| JP | 11-278934 A | 10/1999 |
| JP | 11-278935 A | 10/1999 |
| JP | 2000-1397 A | 1/2000 |
| JP | 2000-129255 A | 5/2000 |
| JP | 2000-203933 A | 7/2000 |
| JP | 2000-261034 A | 9/2000 |
| JP | 2000-281428 A | 10/2000 |
| JP | 2000-290066 A | 10/2000 |
| JP | 2000-302543 A | 10/2000 |
| JP | 2001-036175 A | 2/2001 |
| JP | 2001-036176 A | 2/2001 |
| JP | 2001-158620 A | 6/2001 |
| JP | 2001-158660 A | 6/2001 |
| JP | 2001-185795 A | 7/2001 |
| JP | 2001-187884 A | 7/2001 |
| JP | 2001-192655 A | 7/2001 |
| JP | 2001-220223 A | 8/2001 |
| JP | 2001-270714 A | 10/2001 |
| JP | 2001-270775 A | 10/2001 |
| JP | 2002-009402 A | 1/2002 |
| JP | 2002-154870 A | 5/2002 |
| JP | 2002-198573 A | 7/2002 |
| JP | 2002-226844 A | 8/2002 |
| JP | 2002-232002 A | 8/2002 |
| JP | 2002-317177 A | 10/2002 |
| JP | 2002-335010 A | 11/2002 |
| JP | 2002-344049 A | 11/2002 |
| JP | 2002-353542 A | 12/2002 |
| JP | 2002-371273 A | 12/2002 |
| JP | 2002-371274 A | 12/2002 |
| JP | 2003-13057 A | 1/2003 |
| JP | 2003-020288 A | 1/2003 |
| JP | 2003-34786 A | 2/2003 |
| JP | 2003-34788 A | 2/2003 |
| JP | 2003-34789 A | 2/2003 |
| JP | 2003-34790 A | 2/2003 |
| JP | 2003-101081 A | 4/2003 |
| JP | 2003-105336 A | 4/2003 |
| JP | 2003-128465 A | 5/2003 |
| JP | 2003-179259 A | 6/2003 |
| JP | 2003-207638 A | 7/2003 |
| JP | 2003-267797 A | 9/2003 |
| WO | WO 98/05078 A1 | 2/1998 |

OTHER PUBLICATIONS

Puttbach et al., "Hydrothermal Growth of $Y_3Al_5O_{12}$", Proceedings of the International Conference on Crystal Growth, pp. 569-571, 1967.

E.D. Kolb et al., "Phase Equilibria of $Y_3Al_5O_{12}$, Hydrothermal Growth of $Gd_3Ga_5O_{12}$ and Hydrothermal Epitaxy of Magnetic Garnets", Journal of Crystal Growth, vol. 29, pp. 29-39, 1975.

T. Takamori et al., "Controlled Nucleation for Hydrothermal Growth of Yttrium-Aluminum Garnet Powders", Am. Ceram. Soc. Bull., vol. 65, Issue 9, pp. 1282-1286, 1986.

M.L.F. Phillips et al., "Effects of Processing on the Low-Voltage Performance of Cathodoluminescent Garnet Phosphors", International SAMPE Technical Conference, pp. 501-506, 1995.

M.L.F. Phillips et al., "Photo- and Cathodoluminescence of hydrothermally Synthesized $Y_3Al_5O_{12}$:Tb and $NaY(WO_4)$:Tb", Ceramic Transactions, vol. 67, pp. 89-103, 1996.

L..E. Shea et al., "Phosphor Synthesis Routes and Their Effect on the Performance of Garnet Phosphors at Low-Voltages", Materials Research Society Symposium Proceedings, vol. 424, pp. 409-414, 1997.

R.P. Rao, "Synthesis of Fine Grain YAG:$RE^{3+}$ Phosphors for Low Voltage Display Devices", Proc. SPIE, vol. 2651, pp. 139-146, 1996.

Y. Hakuta et al., "Continuous Production of Phosphor YAG:Tb Nanoparticles by Hydrothermal Synthesis in Supercritical Water", Materials Research Bulletin, vol. 38, pp. 1257-1265, 2003.

T. Haganuma et al., "Synthesis of Phosphor(YAG:Tb) Fine Particles by Hydrothermal Synthesis in Supercritical Water", Koatsuryoku no Kagaku to Gijutsu, vol. 10, p. 98, 2000.

T. Adschiri et al., "Hydrothermal Synthesis of Metal Oxide Fine Particles at Supercritical Conditions", Industrial & Engineering Chemistry Research, vol. 39, pp. 4901-4907, 2000.

T. Adschiri, "Material Synthesis in Supercritical Water-Specific Features of Reactions in Supercritical Water and novel Processes for Organic and Inorganic Syntheses-", Zairyo-to-Kankyo, vol. 49, pp. 126-129, 2000.

Y. Hakuta et al., "Production of Phosphor (YAG:Tb) Fine Particles by Hydrothermal Synthesis in Supercritical Water", Journal of Materials Chemistry, vol. 9, pp. 2671-2674, 1999.

Adeshiri, Chemical Engineering, vol. 43, No. 11, pp. 817-824, 1998.

T. Adschiri, "Production of Metal Oxide Fine Particles via Hydrothermal Synthesis under Supercritical Conditions", Ceramics, vol. 35, No. 7, pp. 534-537, 2000.

Y.S. Cho et al., "Hydrothermal Preparation and Morphology Characteristics of $Y_3Fe_5O_{12}$", Journal of the Ceramic Society, vol. 80, Issue 6, pp. 1605-1608, 1997.

A. Ikesue et al., "Fabrication of Polycrystalline, Transparent YAG Ceramics by a Solid-State Reaction Method", J. Am. Ceram. Soc., vol. 78, Issue 1, pp. 225-228, 1995.

A. Ikesue et al., "Fabrication and Optical Properties of High-Performance Polycrystalline Nd:YAG Ceramics for Solid-State Lasers", J. Am. Ceram. Soc., vol. 78, Issue 4, pp. 1033-1040, 1995.

A. Ikesue et al., "Synthesis of $Nd^{3+}$, $Cr^{3+}$-codoped YAG Ceramics for High-Efficiency Solid-State Lasers", J. Am. Ceram. Soc., vol. 78, Issue 9, pp. 2545-2547, 1995.

A. Ikesue et al., "Role of Si on Nd Solid-Solution of YAG Ceramics", J. Ceram. Soc. Japan, vol. 103, Issue 5, pp. 489-493, 1995.

A. Ikesue et al., "Effects of Neodymium Concentration on Optical Characteristics of Polycrystalline Nd:YAG Laser Materials", J. Am. Ceram. Soc., vol. 79, Issue 7, pp. 1921-1926, 1996.

A. Ikesue et al., "Microstructure and Optical Properties of Hot Isostatically Pressed Nd:YAG Ceramics", J. Am. Ceram. Soc., vol. 79, Issue 7, pp. 1927-1933, 1996.

A. Ikesue et al., "Optical Scattering Centers in Polycrystalline Nd:YAG Laser", J. Am. Ceram. Soc., vol. 80, Issue 6, pp. 1517-1522, 1997.

A. Ikesue et al., "Scattering in Polycrystalline Nd:YAG Lasers", J. Am. Ceram. Soc., vol. 81, Issue 8, pp. 2194-2196, 1998.

A. Ikesue et al., "Influence of Pore Volume on Laser Performance of Nd:YAG Ceramics", J. Mater. Sci., vol. 34, pp. 1189-1195, 1999.

A. Ikesue et al., "Development and Prospect of Ceramics Laser Elements", Laser Review, vol. 27, No. 9, pp. 593-598, 1999.

A. Ikesue et al., "High-Performance Microchip Lasers Using Polycrystalline Nd:YAG Ceramics", Journal of the Ceramic Society of Japan, vol. 108, Issue 4, pp. 428-430, 2000.

A. Ikesue, "Cc:YAG Ceramics Scintillator for Electron Beam Detector", Journal of the Ceramic Society of Japan, vol. 108, Issue 11, pp. 1020-1023, 2000.

A. Ikesue et al., "Synthesis of Pr Heavily-Doped, Transparent YAG Ceramics", Journal of the Ceramic Society of Japan, vol. 109, Issue 7, pp. 640-642, 2001.

Lupei et al., "Laser Emission under Resonant Pump in the Emitting Level of Concentrated Nd:YAG Ceramics", Applied Physics Letters, vol. 79, No. 5, pp. 590-592, 2001.

Lupei et al., "Spectroscopy and Laser Emission under Hot Band Resonant Pump in Highly Doped Nd:YAG Ceramics", Opt. Commun., vol. 195, pp. 225-232, 2001.

Lupei et al., "High-Resolution Spectroscopy and Emission Decay in Concentrated Nd:YAG Ceramics", Journal of the Optical Society of America B, vol. 19, No. 3, pp. 360-368, 2002.

Ikesue et al., "Structure of Nd:YAG Ceramics Having Ultra-Low Scattering and the Development of High Performance Lasers Using Polycrystal Media", FC Report, vol. 20, No. 8, pp. 192-197, 2002.

Sato et al., "Spectral Parameters of $Nd^{3+}$-ion in the Polycrystalline Solid-Solution Composed of $Y_3Al_5O_{12}$ and $Y_3Sc_2Al_3O_{12}$", Japanese Journal of Applied Physics, vol. 42, Part 1, No. 8, pp. 5071-5074, 2003.

Lupei et al., "Energy Transfer Processes of $Nd^{3+}$ in $Y_2O_3$ Ceramic", J. Lumine., vols. 102-103, pp. 72-76, 2003.

Saikawa et al., "Absorption, Emission Spectrum Properties, and Efficient Laser Performances of Yb:$Y_3ScAl_4O_{12}$ Ceramics", Applied Physics Letters, vol. 85, No. 11, pp. 1898-1900, 2004.

Lupei et al., "Single Crystal and Transparent ceramic Nd-doped Oxide Laser Materials: a Comparative Spectroscopic Investigation", J. Alloys and Compounds, vol. 380, pp. 61-70, 2004.

Sekita et al., "Optical Spectra of Undoped and Rare-Earth-(=Pr, Nd, Eu, and Er) Doped Transparent Ceramic $Y_3Al_5O_{12}$", Journal of Applied Physics, vol. 69, Issue 6, pp. 3709-3718, 1990.

Lu et al., "High-Power Nd:$Y_3Al_5O_{12}$ Ceramic Laser", Japanese Journal of Applied Physics, vol. 39, Part 2, No. 10B, pp. L1048-L1050, 2000.

Lu et al., "Highly Efficient 2% Nd:Yttrium Aluminum Garnet Ceramic Laser", Applied Physics Letters, vol. 77, No. 23, pp. 3707-3709, 2000.

Lu et al., "Optical Properties and Highly Efficient Laser Oscillation of Nd:YAG Ceramics", Applied Physics B, vol. 71, pp. 469-473, 2000.

Lu et al., "72 W Nd:$Y_3Al_5O_{12}$ Ceramic Laser", Applied Physics Letters, vol. 78, No. 23, pp. 3586-3588, 2001.

Lu et al., "Promising Ceramic Laser Material: Highly Transparent $Nd^{3+}$:$Lu_2O_3$ Ceramic", Applied Physics Letters, vol. 81, No. 23, pp. 4324-4326, 2002.

Kong et al., "Diode-Pumped Yb:$Y_2O_3$ Ceramic Laser", Applied Physics Letters, vol. 82, No. 16, pp. 2556-2558, 2003.

J. Lu et al., "$Yb^{3+}$:$Sc_2O_3$ Ceramic Laser", Applied Physics Letters, vol. 83, No. 6, pp. 1101-1103, 2003.

A.A. Kaminskii et al., "New Data on the Physical Properties of $Y_3Al_5O_{12}$-Based Nanocrystalline Laser Ceramics", Crystallography Reports, vol. 48, No. 3, pp. 515-519, 2003.

A.A. Kaminsukii et al., "Refractive Indices of Laser Nanocrystalline Ceramics Based on $Y_3Al_5O_{12}$", Crystallography Reports, vol. 48, No. 5, pp. 868-871, 2002.

F. Bisson et al., "Laser Damage Threshold of Ceramic YAG", Japanese Journal of Applied Physics, vol. 42, Part 2, No. 8B, pp. L1025-L1027, 2003.

A. Shirakawa et al., "Diode-Pumped Mode-Locked $Yb^{3+}$:$Y_2O_3$ Ceramic Laser", Optics Express, vol. 11, No. 22, pp. 2911-2916, 2003.

K. Takaichi et al., "Highly Efficient Continuous-Wave Operation at 1030 and 1075 nm Wavelengths of LD-Pumped $Yb^{3+}$:$Y_2O_3$ Ceramic Lasers", Applied Physics Letters, vol. 84, No. 3, pp. 317-319, 2004.

T. Tachiwaki et al., "Novel Synthesis of $Y_3Al_5O_{12}$ (YAG) Leading to Transparent Ceramics", Solid State Communications, vol. 119, pp. 603-606, 2001.

* cited by examiner

TRANSLUCENT MATERIAL AND MANUFACTURING METHOD OF THE SAME

This is a national stage application under 35 U.S.C. § 371 of PCT/JP2006/306492 filed on Mar. 29, 2006, which claims priority from Japanese patent application 2005-104615 filed on Mar. 31, 2005, all of which are incorporated herein by reference.

TECHNICAL FIELD

The present invention relates to a translucent material used in ceramic materials that oscillate based on excitation by a semiconductor laser, and light-emitting ceramic materials that adjusts the color tone of a semiconductor light emitting diode based on excitation by light emitted from the semiconductor light emitting diode.

BACKGROUND ART

By doping with rare earths, YAG (=$Y_3Al_5O_{12}$) becomes a solid laser oscillation material, and although researched extensively, the majority of studies have used monocrystals. Nonetheless, recent findings have revealed that sintered ceramics can impart equivalent characteristics, and therefore research and development worldwide, especially in Japan, is taking up approaches to solid laser materials based on transparent ceramics that have superior cost advantages.

Reviewing the research history, the YAG family first appears when the hydrothermal synthesis of (Y, Tb, Dy, Ho, Yb)$_3$Al$_5$O$_{12}$ was reported in Russia in 1967. They used sodium carbonate and chlorides of the constituting elements, and, briefly, conducted additional research on the synthesis conditions for $Y_3Al_5O_{12}$ and garnets such as $Y_3Ga_5O_{12}$, $Nd_3Ga_5O_{12}$, $Sm_3Ga_5O_{12}$ under high temperature and pressure of 500° C. or more and several thousand atmospheres, but the reaction system itself was not water and steam pressurization, and the reaction was clearly promoted by a method of applying gas pressure externally (B. V. Mill, Kristalografiya, Vol. 12, No. 1, pp. 158-160, 1967, and B. V. Mill, "Hydrothermal Synthesis of Aluminum and Gallium Garnets", Sov. Phys.-Crystallogr., Vol. 12, No. 1, pp. 137-139, 1969). Moreover, there were research reports on the hydrothermal synthesis of YAG at about that time (R. C. Puttbach et al., "Hydrothermal Growth of $Y_3Al_5O_{12}$", Proceedings of the International Conference on Crystal Growth, pp. 569-571, 1967 and E. D. Kolb and R. A. Laudise, "Phase Equilibria of $Y_3Al_5O_{12}$, Hydrothermal Growth of $Gd_3Ga_5O_{12}$ and Hydrothermal Epitaxy of Magnetic Garnets", Journal of Crystal Growth, Vol. 29, pp. 29-39, 1975), but these were the same regarding the reaction system. Then, there was nothing at all in these articles regarding the concept of space filling with polyhedron microparticles.

Subsequently in 1986, hydrothermal synthesis was conducted using special source materials, and Tb:YAG crystal microparticles having several forms were synthesized (T. Takamori and L. D. David, "Controlled Nucleation for Hydrothermal Growth of Yttrium-Aluminum Garnet Powders", Am. Ceram. Soc. Bull., Vol. 65, Issue 9, pp. 1282-1286, 1986). In this method, a chloride solution or citric acid solution is spray dried in the first stage, the crystal nucleation density is next adjusted by heating, and then hydrothermal synthesis is conducted in an autoclave, and therefore the process was extremely complicated and non-productive. Further, the present invention, which directly precipitates crystals from the solution phase is fundamentally different.

As a part of the development of new luminescent microparticles, an application was submitted for Tb:YAG microparticles in 1989 (U.S. Pat. No. 5,037,577). The method described here was different from that of the aforementioned Russian research group and that of T. Takamori and L. D. David, Am. Ceram. Soc. Bull., and was hydrothermal synthesis from a simple aqueous solution, specifically, yttrium-aluminum garnet microparticles were produced by allowing a hydrolytic degradation product of an yttrium compound or yttrium salt, and a hydrolytic degradation product of an aluminum compound or aluminum salt to react in an alkali aqueous solution of pH 10.0 or more at a reaction temperature of 270° C.

However, although U.S. Pat. No. 5,037,577 is substantially the same type as the present invention in the procedures of producing hydrothermal microcrystal particles, the present invention is a technical conception related to the point of not only synthesizing these microparticles, but also of controlling the exterior shape thereof and somehow obtaining a sintered body with a polyhedron filled structure. U.S. Pat. No. 5,037,577 did not study this point at all.

Since 1995, Sandia National Laboratories has reported hydrothermal synthesis of YAG-Tb for low acceleration voltage displays (M. L. F. Phillips and L. E. Shea, "Effects of Processing on the Low-Voltage Performance of Cathodoluminescent Garnet Phosphors", International SAMPE Technical Conference, pp. 501-506, 1995 and M. L. F. Phillips and B. G. Potter, Jr., "Photo- and Cathodoluminescence of hydrothermally Synthesized $Y_3Al_5O_{12}$:Tb and NaY(WO$_4$):Tb", Ceramic Transactions, Vol. 67, pp. 89-103, 1996). Nonetheless, all of these differ from the common method of hydrothermal synthesis, and resemble the flax method in which the substance in solution is heated at 500° C., and then this amorphous body is loaded in an autoclave and processed in the vicinity of 600° C. Consequently, this manufacturing method is vastly different from the hydrothermal synthesis method founded on liquid phase. In 1997, these authors broadened the range of the synthesis compositions beyond YAG:Tb to GGG:Tb and YGG:Tb, but the manufacturing method was not changed (L. E. Shea et al., "Phosphor Synthesis Routes and Their Effect on the Performance of Garnet Phosphors at Low-Voltages", Materials Research Society Symposium Proceedings, Vol. 424, pp. 409-414, 1997). Of course, there was no description of a special stage relating to the shape of the microparticles and to techniques of making sintered bodies thereof.

Further, there were reports of obtaining spherical particles of YAG:Tm, Tb, Eu through a sol-gel method as luminescent materials for low acceleration voltage displays (R. P. Rao, "Synthesis of Fine Grain YAG:RE$^{3+}$ Phosphors for Low Voltage Display Devices", Proc. SPIE, Vol. 2651, pp. 139-146, 1996), but with thermal processing at 1200° C. and the like, it would be difficult to say that this is a preferable method in terms of industrial applicability.

More recently, Adschiri et al. of Tohoku University applied the broad range of reactivity of ultracritical fluids to microparticle synthesis, and reported the synthesis of barium hexaferrite and of Tb doped YAG microparticles as reported in the past using special linked syntheses equipment (Y. Hakuta et al., "Continuous Production of Phosphor YAG:Tb Nanoparticles by Hydrothermal Synthesis in Supercritical Water", Materials Research Bulletin, Vol. 38, pp. 1257-1265, 2003, T. Haganuma et al., "Synthesis of Phosphor(YAG:Tb) Fine Particles by Hydrothermal Synthesis in Supercritical Water", Koatsuryoku no Kagaku to Gijutsu, Vol. 10, p. 98, 2000, T. Adschiri et al., "Hydrothermal Synthesis of Metal Oxide Fine Particles at Supercritical Conditions", Industrial & Engineering Chemistry Research, Vol. 39, pp. 4901-4907, 2000, T. Adschiri, "Material Synthesis in Supercritical Water-Specific Features of Reactions in Supercritical Water and novel Processes for Organic and Inorganic Syntheses-", Zairyo-to-Kankyo, Vol. 49, pp. 126-129, 2000, Y. hakuta et al., "Production of Phosphor (YAG:Tb) Fine Particles by Hydrothermal Synthesis in Supercritical Water", Journal of Materials Chemistry, Vol. 9, pp. 2671-2674, 1999, T. Adeshiri, Chemical Engineering, Vol. 43, No. 11, pp. 817-824, 1998, T. Adschiri, "Production of Metal Oxide Fine Particles via Hydrothermal Synthesis under Supercritical Conditions", Ceramics, Vol. 35, No. 7, pp. 534-537, 2000). Nonetheless, this is special equipment, and problems appear to remain in terms of production characteristics and uniform conditions. Moreover, although Japanese Unexamined Patent Publication No. 2000-129255 describes a manufacturing method going through hydrothermal processing of terbium-activated indium aluminum oxide luminescent material (including compositions with a garnet structure) applicable to forming uniform and dense high-intensity luminescent films for cathode ray tubes, luminescent lamps, plasma display panels and field emission displays, it is difficult to say that the production characteristics are applicable as a manufacturing method.

A Korean group formed by Pusan University and LG Electronics has studied Tb:YAG synthesis conditions in the alkali region using KOH and $NH_4OH$, and have obtained 0.2μ YAG particles in a reaction at 350° C. for 12 hours. Further, they have synthesized the composition zone of $(Tb_xY_{1-x})_3Al_5O_{12}$, but all of these are no more than synthesis of microparticles in the same way as U.S. Pat. No. 5,037,577, and there has been no investigation on the point of obtaining a sintered body with a polyhedron filled structure by controlling the external form. (S-H. Gee et al., Han'guk Seramik Hakhoechi, Vol. 37, No. 8, pp. 739-744, 2000 and S-M. Kim et al., Han'guk Seramik Hakhoechi, Vol. 37, No. 8, pp. 745-750, 2000)

Japanese Unexamined Patent Publication Nos. 2001-187884, 2002-226844, 2002-371273, 2002-371274, 2003-013057, 2003-034786, 2003-034788, 2003-034789 and 2003-034790 are well-known to contain expertise relating to the hydrothermal synthesis of luminescent materials. However, the luminescent materials claimed in this patent literature are luminescent materials that emit in the visible region by ultraviolet ray excitation, and are fundamentally different than the present invention because these materials are not used in a high-density sintered form, and are limited to used as a powder.

Meanwhile, well-known manufacturing methods of luminescent material with pigment that are related to hydrothermal synthesis include Japanese Unexamined Patent Publication Nos. 5(1993)-331461, 5(1993)-331462, 6(1994)-033051 and 6(1994)-041526. The targeted materials therein are a material group with $mCoO.nAl_2O_3$ (m/n=0.9) cobalt blue pigments mixed in a ZnS:Ag, Cl blue emitting luminescent material group, and luminescent material of $Y_2O_3$:Eu with adhered colcothar, and the content and objectives differ from those of the present invention.

Knowledge on manufacturing of luminescent material by hydrothermal synthesis is disclosed in Japanese Unexamined Patent Publication No. 9(1997)-291279 regarding $ZnGa_2O_4$ crystals, and in U.S. Pat. No. 5,893,999 regarding $LaPO_4$:Ce, Tb luminescent material. Nonetheless, not only are the crystal structures of these materials not the garnet structures, C-rare earth structures, $A_2SiO_5$ structures, perovskite structures or gadolinium orthoferrite ($GdFeO_3$) structures that are the focus of the present applicant, but there were no disclosures relating to sintering, and the like. Thus, these inventions are completely different than the present invention.

Moreover, in regard to functional materials using a hydrothermal synthesis (processing) method, Japanese Unexamined Patent Publication Nos. 3(1991)-159917 and 2000-001397 disclose the hydrothermal synthesis of a rare earth iron garnet material as a coated magnetooptic recording medium; and Y. S. Cho et al., "Hydrothermal Preparation and Morphology Characteristics of $Y_3Fe_5O_{12}$", Journal of the American Ceramic Society, Vol. 80, Issue 6, pp. 1605-1608, 1997 discloses the same hydrothermal synthesis of $Y_3Fe_5O_{12}$ (=YIG) material. Described in this literature are materials having a garnet structure, which is one of the crystal structures addressed by the present applicant, but because of the large visible range absorption based on the admixture of Fe ions, these materials are not suitable for use in ceramic materials that oscillate when excited by semiconductor lasers, or in light-emitting ceramic materials that adjust the color tone of a semiconductor light emitting diode when excited by light emitted from a semiconductor light-emitting diode; and are different than the materials of the present invention.

Meanwhile, when investigating translucent ceramics, there is Japanese Unexamined Patent Publication No. 5(1993)-139862, which attempts to obtain a transparent ceramic after producing PLZT microparticles by hydrothermal synthesis, but these PLZT microparticles are an optically passive material, and are not a light-emitting, luminescent material. In addition, Japanese Unexamined Patent Publication No. 5(1993)-139862 does not disclose sintering using a polyhedron particle as the departure raw material, does not include the technical concept of the uniformity of the particles of the sintered body, and differs greatly from the present invention.

Looking at the worldwide situation, the group of A. Ikesue et al. and the joint research group of Yanagitani and Haneda comprise the two main foundations in the development of inventions relating to transparent ceramic laser oscillator materials for solid lasers. The work of these groups will be explained below.

In Japanese Unexamined Patent Publication No. 5(1993)-301770, the group of A. Ikesue et al. describes as a polycrystal transparent ceramic for lasers a sintered body having a garnet structure with 1% or less porosity comprising one or two or more kinds in $SiO_2$, $Li_2O$, $Na_2O$, MgO, or CaO, and one or two or more kinds in a lanthanide element, Cr element, or Ti element as a light-emitting element. Described in Japanese Unexamined Patent Publication No. 5(1993)-294724 a polycrystal transparent YAG ceramic for a solid laser in which 50 to 20000 weight ppm of one type or more of a fluoride compound comprising a group of $YF_3$, $AlF_3$, NaF, $MgF_2$, $CaF_2$, or LiF is added as sintering aid. However, the ceramics described in Japanese Unexamined Patent Publication Nos. 5(1993)-301770 and 5(1993)-294724 are manufactured by a process different from the method of using crystalline microparticles from hydrothermal synthesis in the departure raw material, and do not require a uniform particle shape or particle diameter in the ceramic sintered body; and the attempt is to promote as high a density as possible by the effects of the aforementioned additives and methods of adjusting the departure raw materials, which is different from the present invention.

Moreover, inventions related to materials for transparent YAG or garnet crystal structure raw material laser oscillators include: Japanese Unexamined Patent Publication No. 3(1991)-218963 that stipulates a process similar to the common solid phase reaction and several sintering additive; Japanese Unexamined Patent Publication No. 5(1993)-175591 that stipulates a laminate structure of monocrystal YAG and polycrystal YAG ceramics; Japanese Unexamined Patent Publication No. 5(1993)-235462 that stipulates a YAG manufacturing method based on a solid phase reaction process that stipulates the specific surface area of $Al_2O_3$ and $Y_2O_3$ powders, which are the raw materials; Japanese Unexamined Patent Publication No. 5(1993)-286761 that stipulates the amount of oxide synthesizing components of $Li_2O$, $Na_2O$, MgO, CaO, and $SiO_2$ as sintering aids; Japanese Unexamined Patent Publication No. 5(1993)-286762 that stipulates the use of one or more kinds of $YF_3$, $AlF_3$, NaF, $MgF_2$, $CaF_2$, and LiF fluorides as additional sintering aids; Japanese Unexamined Patent Publication No. 5(1993)-294709 that stipulates the mean particle size of the ceramic sintered body after production; Japanese Unexamined Patent Publication No. 5(1993)-294722 that stipulates that raw material $Al_2O_3$ and $Y_2O_3$ powders be used with respective primary particle sizes of 0.1 to 5 μm and 0.01 to 2 μm; Japanese Unexamined Patent Publication No. 5(1993)-294723 that stipulates the primary particle size and oxide components of $Li_2O$, $Na_2O$, MgO, CaO, and $SiO_2$ as sintering aids; Japanese Unexamined Patent Publication No. 5(1993)-301769 that claims a garnet structure containing F ions; Japanese Unexamined Patent Publication No. 5(1993)-335678 that broadly describes one or more kinds of lanthanide elements, Cr and Ti elements, YAG monocrystals for lasers containing 0.005 to 1 weight % Si elements, and the range of impurities; Japanese Unexamined Patent Publication No. 6(1994)-211563 that stipulates a polycrystal transparent ceramic for laser nuclear fusion having a garnet structure; Japanese Unexamined Patent Publication No. 2001-220223 that stipulates the manufacturing process such as the stage of obtaining $Y_2O_3$ in which Nd is uniformly distributed; Japanese Unexamined Patent Publication No. 2003-267797 that stipulates and mentions small tilt grain boundaries and dislocation density; Japanese Unexamined Patent Publication No. 5(1993)-330912 that relates to polycrystal transparent $Y_2O_3$ ceramic for lasers, which is a ceramic other than one with a garnet structure, with a stipulated porosity, particle size and the like; Japanese Unexamined Patent Publication No. 5(1993)-330913 that relates to polycrystal transparent $Y_2O_3$ ceramic for lasers, which in addition to mean particle size and porosity, stipulates one or more kinds of $ThO_2$, $HfO_2$, $ZrO_2$, $Li_2O$, LiF, BeO and $Al_2O_3$ as well as additives and the like; and Japanese Unexamined Patent Publication No. 6(1994)-211573 that relates to a $Y_2O_3$ manufacturing method that stipulates a reaction using powder consisting of molded body density of 94% or more prior to sintering. Further publications include: A. Ikesue et al., "Fabrication of Polycrystalline, Transparent YAG Ceramics by a Solid-State Reaction Method", J. Am. Ceram. Soc., Vol. 78, Issue 1, pp. 225-228, 1995, A. Ikesue et al., "Fabrication and Optical Properties of High-Performance Polycrystalline Nd:YAG Ceramics for Solid-State Lasers", J. Am. Ceram. Soc., Vol. 78, Issue 4, pp. 1033-1040, 1995, A. Ikesue et al., "Synthesis of $Nd^{3+}$, $Cr^{3+}$-codoped YAG Ceramics for High-Efficiency Solid-State Lasers", J. Am. Ceram. Soc., Vol. 78, Issue 9, pp. 2545-2547, 1995, A. Ikesue and K. Kamata, "Role of Si on Nd Solid-Solution of YAG Ceramics", J. Ceram. Soc. Japan, Vol. 103, Issue 5, pp. 489-493, 1995, A. Ikesue et al., "Effects of Neodymium Concentration on Optical Characteristics of Polycrystalline Nd:YAG Laser Materials", J. Am. Ceram. Soc., Vol. 79, Issue 7, pp. 1921-1926, 1996, A. Ikesue and K. Kamata, "Microstructure and Optical Properties of Hot Isostatically Pressed Nd:YAG Ceramics", J. Am. Ceram. Soc., Vol. 79, Issue 7, pp. 1927-1933, 1996, A. Ikesue et al., "Optical Scattering Centers in Polycrystalline Nd:YAG Laser", J. Am. Ceram. Soc., Vol. 80, Issue 6, pp. 1517-1522, 1997, A. Ikesue and K. Yoshida, "Scattering in Polycrystalline Nd:YAG Lasers", J. Am. Ceram. Soc., Vol. 81, Issue 8, pp. 2194-2196, 1998, A. Ikesue and K. Yoshida, "Influence of Pore Volume on Laser Performance of Nd:YAG Ceramics", J. Mater. Sci., Vol. 34, pp. 1189-1195, 1999, A. Ikesue et al., "Development and Prospect of Ceramics Laser Elements", Laser Review, Vol. 27, No. 9, pp. 593-598, 1999, A. Ikesue et al., "High-Performance Microchip Lasers Using Polycrystalline Nd:YAG Ceramics", Journal of the Ceramic Society of Japan, Vol. 108, Issue 4, pp. 428-430, 2000, A. Ikesue, "Ce:YAG Ceramics Scintillator for Electron Beam Detector", Journal of the Ceramic Society of Japan, Vol. 108, Issue 11, pp. 1020-1023, 2000, A. Ikesue and Y. Sato, "Synthesis of Pr Heavily-Doped, Transparent YAG Ceramics", Journal of the Ceramic Society of Japan, Vol. 109, Issue 7, pp. 640-642, 2001, V. Lupei et al., "Laser Emission under Resonant Pump in the Emitting Level of Concentrated Nd:YAG Ceramics", Applied Physics Letters, Vol. 79, No. 5, pp. 590-592, 2001, V. Lupei et al., "Spectroscopy and Laser Emission under Hot Band Resonant Pump in Highly Doped Nd:YAG Ceramics", Opt. Commun., Vol. 195, pp. 225-232, 2001, V. Lupei et al., "High-Resolution Spectroscopy and Emission Decay in Concentrated Nd:YAG Ceramics", Journal of the Optical Society of America B, Vol. 19, No. 3, pp. 360-368, 2002, A. Ikesue et al., "Structure of Nd:YAG Ceramics Having Ultra-Low Scattering and the Development of High Performance Lasers Using Polycrystal Media", FC Report, Vol. 20, No. 8, pp. 192-197, 2002, Y. Sato et al., "Spectral Parameters of $Nd^{3+}$—ion in the Polycrystalline Solid-Solution Composed of $Y_3Al_5O_{12}$ and $Y_3Sc_2Al_3O_{12}$", Japanese Journal of Applied Physics, Vol. 42, Part 1, No. 8, pp. 5071-5074, 2003, A. Lupei et al., "Energy Transfer Processes of $Nd^{3+}$ in $Y_2O_3$ Ceramic", J. Lumine., Vols. 102-103, pp. 72-76, 2003, J. Saikawa et al., "Absorption, Emission Spectrum Properties, and Efficient Laser Performances of Yb:$Y_3ScAl_4O_{12}$ Ceramics", Applied Physics Letters, Vol. 85, No. 11, pp. 1898-1900, 2004, and V. Lupei et al., "Single Crystal and Transparent ceramic Nd-doped Oxide Laser Materials: a Comparative Spectroscopic Investigation", J. Alloys and Compounds, Vol. 380, pp. 61-70, 2004. However, the ceramics described in the patent and non-patent literature above fundamentally differ from the present invention on the point that crystalline microparticles obtained by hydrothermal synthesis, which is synthesis directly in liquid phase, are not taken as the departure raw materials as previously described.

On the other hand, regarding the joint research group of Yanagitani and Haneda: described in Japanese Unexamined Patent Publication No. 2(1990)-092817 is a manufacturing method of yttrium aluminum garnet that stipulates the effect of using a specific "urea precipitation method", in which an acidic aqueous solution comprising yttrium ions and aluminum ions is neutralized with urea to cause a precursor of YAG microparticles to precipitate; in Japanese Unexamined Patent Publication No. 2(1990)-283663 is described a translucent polycrystal yttrium aluminum garnet and manufacturing method thereof that stipulates translucent polycrystal yttrium aluminum garnet in the early phase in which the Y element of yttrium aluminum garnet $Y_3Al_5O_{12}$ is substituted with 0.1 to 5 atomic % of a group comprising lanthanide elements and Cr elements with an atomic number of 58 to 71, and 100 to 2500 wtppm of $SiO_2$ by weight ratio is added; and in Japanese Unexamined Patent Publication No. 4(1992)-055363 is described a translucent polycrystal yttrium aluminum garnet sintered body and manufacturing method thereof that stipulates the mol ratio of $Y_2O_3$ and $Al_2O_3$, and the fluorine content in the sintered body. However, the YAG described in Japanese Unexamined Patent Publication Nos. 2(1990)-092817, 2(1990)-283663 and 4(1992)-055363 fundamentally differ from the present invention on the point that crystalline microparticles obtained by hydrothermal synthesis, which is synthesis directly in liquid phase, are not taken as the departure raw materials as previously described.

In addition, well-known inventions related to laser oscillator materials comprising transparent YAG or garnet crystal structure material include: Japanese Unexamined Patent Publication No. 1(1999)-093404 that stipulates a urea precipitation method that causes precipitation once an acidic aqueous solution comprising yttrium ions and aluminum ions has been neutralized with urea; Japanese Unexamined Patent Publication No. 10(1998)-067555 that is a translucent ceramic with a garnet crystal structure having main components of $Al_2O_3$ and $Y_2O_3$, and stipulates the size of the standard production Gibbs energy ($\Delta Gf°$); Japanese Unexamined Patent Publication No. 10(1998)-101333, characterized in that a salt such as ammonium carbonate is used in the presence of sulfate ions, and insoluble salts comprising yttrium ions and aluminum ions are crystallized; Japanese Unexamined Patent Publication No. 10(1998)-101334 that describes a method in which hydroxyl acid is contained in a mineral acid salt aqueous solution of yttrium and aluminum, and then a precipitate is obtained by neutralizing with urea and is taken as an yttrium aluminum garnet raw material powder; Japanese Unexamined Patent Publication No. 10(1998)-101411 that stipulates that a YAG precursor is crystallized by adding a mineral acid salt aqueous solution of yttrium salt, aluminum salt and garget composition into an alkaline carbonate aqueous solution, and then is sintered; Japanese Unexamined Patent Publication No. 10(1998)-114519 that stipulates thoroughly cleaning a precipitate obtained by a urea method until the non-related negative ion concentration is 2000 wtppm or less; Japanese Unexamined Patent Publication No. 11(1999)-147757 that stipulates a translucent ceramic that is a garnet structure compound comprising the composition formula $M_3Al_5O_{12}$, and M comprises at least Er, Tm, Ho, Dy, Lu, and Tb; U.S. Pat. No. 6,200,918 that stipulates a high corrosion-resistant rare earth aluminum garnet ceramic with a Tm, Yb, Lu total content of 10 to 100 mol %; Japanese Unexamined Patent Publication No. 2000-290066 that stipulates a $Y_3Al_5O_{12}$ polycrystal translucent ceramic as a material applied to semiconductor parts requiring additional resistance to chemical corrosion and resistance to plasma; Japanese Unexamined Patent Publication No. 2001-158660 that stipulates the pore concentration and linear transparency of a sintered body having a garnet structure represented by the general formula $R_3Al_5O_{12}$ (R is any one type of rare earth element selected from Y, Dy, Ho, Er, Tm, Yb, and Lu); Japanese Unexamined Patent Publication No. 2003-020288 characterized by a junction with a polycrystal body, and the free face when forming a cast molded body is taken as the junction surface; U.S. Patent Application Publication No. 20030214986 that stipulates a compound laser rod having plastic deformation on the periphery of the laser rod and covered by an integrated garnet structure layer and a $Re_2O_3$ structure layer; Japanese Unexamined Patent Publication No. 11(1999)-157933 that stipulates comprising $Y_2O_3$, a translucent ceramic of $R_2O_3$ (R represents a rare earth), and an additive of CaO or MgO as a ceramic with a structure other than that of garnet; U.S. Pat. No. 6,825,144 stipulated by the transparency, Al content and Si content of a sintered material expressed by the general formula $R_2O_3$ (R is at least one element of the group comprising Y, Dy, Ho, Er, Tm, Yb, and Lu); Japanese Unexamined Patent Publication No. 2003-128465 stipulated by the Al content and linear transparency of a scandium oxide ($Sc_2O_3$) translucent sintered body; and Japanese Unexamined Patent Publication No. 2003-207638 that relates to a polarized light beam splitter for a liquid crystal display using an yttria ceramic. Further publications include: M. Sekita et al., "Optical Spectra of Undoped and Rare-Earth-(=Pr, Nd, Eu, and Er) Doped Transparent Ceramic $Y_3Al_5O_{12}$", Journal of Applied Physics, Vol. 69, Issue 6, pp. 3709-3718, 1990, J. Lu et al., "High-Power Nd:$Y_3Al_5O_{12}$ Ceramic Laser", Japanese Journal of Applied Physics, Vol. 39, Part 2, No. 10B, pp. L1048-L1050, 2000, J. Lu et al., "Highly Efficient 2% Nd:Yttrium Aluminum Garnet Ceramic Laser", Applied Physics Letters, Vol. 77, No. 23, pp. 3707-3709, 2000, J. Lu et al., "Optical Properties and Highly Efficient Laser Oscillation of Nd:YAG Ceramics", Applied Physics B, Vol. 71, pp. 469-473, 2000, J. Lu et al., "72 W Nd:$Y_3Al_5O_{12}$ Ceramic Laser", Applied Physics Letters, Vol. 78, No. 23, pp. 3586-3588, 2001, J. Lu et al., "Promising Ceramic Laser Material: Highly Transparent $Nd^{3+}$:$Lu_2O_3$ Ceramic", Applied Physics Letters, Vol. 81, No. 23, pp. 4324-4326, 2002, J. Kong et al., "Diode-Pumped Yb:$Y_2O_3$ Ceramic Laser", Applied Physics Letters, Vol. 82, No. 16, pp. 2556-2558, 2003, J. Lu et al., "$Yb^{3+}$:$Sc_2O_3$ Ceramic Laser", Applied Physics Letters, Vol. 83, No. 6, pp. 1101-1103, 2003, A. A. Kaminskii et al., "New Data on the Physical Properties of $Y_3Al_5O_{12}$-Based Nanocrystalline Laser Ceramics", Crystallography Reports, Vol. 48, No. 3, pp. 515-519, 2003, A. A. Kaminsukii et al., "Refractive Indices of Laser Nanocrystalline Ceramics Based on $Y_3Al_5O_{12}$", Crystallography Reports, Vol. 48, No. 5, pp. 868-871, 2002, J-F. Bisson et al., "Laser Damage Threshold of Ceramic YAG", Japanese Journal of Applied Physics, Vol. 42, Part 2, No. 8B, pp. L1025-L1027, 2003, A. Shirakawa et al., "Diode-Pumped Mode-Locked $Yb^{3+}$:$Y_2O_3$ Ceramic Laser", Optics Express, Vol. 11, No. 22, pp. 2911-2916, 2003, and K. Takaichi et al., "Highly Efficient Continuous-Wave Operation at 1030 and 1075 nm Wavelengths of LD-Pumped $Yb^{3+}$:$Y_2O_3$Ceramic Lasers", Applied Physics Letters, Vol. 84, No. 3, pp. 317-319, 2004. However, the descriptions of the patent and non-patent literature above fundamentally build upon the fact that a departure raw material is manufactured by a urea precipitation method that obtains a precipitate product by adding urea to a metal salt mixed solution, or by a method that causes precipitation by ammonium carbonate and ammonium sulfate, and these methods differ vastly from that of the present invention, which manufactures a departure raw material using hydrothermal synthesis that synthesizes in direct liquid phase.

Meanwhile, the group of Ikegami et al. at the Inorganic Materials Laboratory has been conducting research related to transparent ceramics that enters into the purview of solid lasers. Described in Japanese Unexamined Patent Publication No. 11(1999)-130428 is an easily sintered yttrium aluminum garnet powder manufacturing method that stipulates using an alkali to cause coprecipitation of a solution comprising yttrium ions and aluminum ions, and then conducting high temperature processing to obtain a powder made of YAG crystal; and in Japanese Unexamined Patent Publication No. 2000-203933 is the manufacturing method of a transparent yttrium aluminum garnet sintered body using a dry mixture method that stipulates the weight % of sulfur to be contained, the primary particle size of the raw material powder, the gas components when sintering, and the like. However, the YAG described in Japanese Unexamined Patent Publication Nos. 11(1999)-130428 and 2000-203933 is one in which the YAG phase is first produced in a solid phase reaction in the sintering process, and is fundamentally different than the present invention in which crystal microparticles, which are the same as the target composition, are taken as the departure raw material.

Further well-known patents include: Japanese Unexamined Patent Publication No. 9(1997)-110420 that describes YAG sintered body production characterized by causing an acid solution comprising yttrium ions and aluminum ions to precipitate at a specified pH, and by subsequently passing through a cleaning process; Japanese Unexamined Patent Publication No. 9(1997)-315865 that stipulates a method of producing transparent yttrium by passing though a process at one end that causes yttrium carbonate to precipitate from solution; Japanese Unexamined Patent Publication No. 10(1998)-273364 that stipulates a method to produce transparent yttrium taking a substance obtained by thermal decomposition as the departure raw material, and calcium is contained therein; Japanese Unexamined Patent Publication No. 11(1999)-189413 that stipulates yttrium thin flake particles are calcinated in the presence of sulfate ions into yttrium hydroxide congealed into a card house shape; Japanese Unexamined Patent Publication No. 11(1999)-278933 characterized in that pre-sintering of a molded body is conducted at a relatively low temperature when calcining yttrium carbonate cleaned with an aqueous solution comprising sulfate ions; Japanese Unexamined Patent Publication No. 11(1999)-278934 that stipulates a manufacturing method that, after precipitating yttrium carbonate from solution, executes control such that when thermally processing a constant equilibrium state is maintained between the carbonic acid gas pressure $P\ CO_2$ in the atmosphere in the reaction tank and the carbonic acid gas pressure $P\ CO_2$ in the reaction solution; Japanese Unexamined Patent Publication No. 11(1999)-278935 indicates the range of transparency in an yttrium oxide sintered body, and further stipulates the fluorine content; Japanese Unexamined Patent Publication No. 2000-281428 that stipulates in a transparent magnesia sintered body the mean particle size comprising $SiO_2$ and $B_2O_3$ as additives in the desired concentration; Japanese Unexamined Patent Publication No. 2001-270714 that, in a coprecipitation method in the presence of sulfate ions, uses a technique such that no yttrium carbonate is produced during the process; Japanese Unexamined Patent Publication No. 2001-270775 characterized in that thermal processing is conducted on an amorphous phase precipitate obtained by instilment of acid salt aqueous solution of yttrium and aluminum into carbonic acid containing a basic salt water solution in the presence of sulfate ions; and Japanese Unexamined Patent Publication No. 2002-154870 that relates to a transparent magnesium spinel sintered body that, in a coprecipitation method, passes through a process of precipitation in an environment comprising carbonate ions and ammonium ions. Also well-known is T. Tachiwaki et al., "Novel Synthesis of $Y_3Al_5O_{12}$ (YAG) Leading to Transparent Ceramics", Solid State Communications, Vol. 119, pp. 603-606, 2001. However, the descriptions in the patent and non-patent literature above stipulate various types of additives and detailed conditions during processing, but are different than the present invention because crystal microparticles, which are the same as the target composition, are not used as the departure raw material.

Transparent YAG ceramics are also being developed by the group of Murakawa et al. at Kyocera. Concretely, well-known technology includes: a transparent yttrium-aluminum-garnet sintered body and manufacturing method thereof characterized in that at least one type of metal of Fe, W, Mo, Pd, and Ag is contained at 0.01 to 0.1 wt % (Japanese Unexamined Patent Publication No. 6(1994)-144925); a manufacturing method of a transparent yttrium-aluminum-garnet sintered body characterized in that YAG powder of the target composition is mixed in a mixed powder of $Y_2O_3$ and $Al_2O_3$, which are the raw material powders (Japanese Unexamined Patent Publication No. 6(1994)-122551); a manufacturing method of a transparent yttrium-aluminum-garnet sintered body characterized in that a YAG phase of 10 to 50% is produced during calcination (Japanese Unexamined Patent Publication No. 6(1994)-107456); a manufacturing method of a transparent yttrium-aluminum-garnet sintered body characterized by a process that specifies the range of X-ray diffraction strength ratio of the crystal phases produced between $Y_2O_3$ and $Al_2O_3$ in the middle of the calcination process (Japanese Unexamined Patent Publication No. 8(1996)-268751); a manufacturing method of a yttrium-aluminum-garnet powder that stipulates the manufacturing process of the YAG to be calcinated after a precipitate is produced by mixing and neutralizing aluminum hydroxide powder and yttrium compound solution (Japanese Unexamined Patent Publication No. 8(1996)-183613); and there are also Japanese Unexamined Patent Publication Nos. 7(1995)-082025, 7(1995)-114342, 8(1996)-203119, 8(1996)-264155, 8(1996)-298099, 8(1996)-322926, 8(1996)-325054, 8(1996)-327845, 9(1997)-045287, 9(1997)-293774, 9(1997)-320524, 10(1998)-064481, 10(1998)-162776 and 10(1998)-236871. In the above patent literature, as in Japanese Unexamined Patent Publication No. 6(1994)-122551 for example, YAG crystals the same as the target crystal structure are used in the departure raw materials, but these are mixed in order to promote a solid phase reaction by providing one type of template, which is vastly different than the present invention that from the beginning uses microparticles having the same structure as the structure of the target crystals as the majority of the departure raw materials.

Further, Japanese Unexamined Patent Publication No. 2001-158620 describes a sintered body using a rare earth-aluminum-garnet micropowder containing a total of 10 to 10000 ppm of at least one type or more among Mg, Si and Ca compounds, and is characterized by YAG microparticles with a specific surface area of 3.5 $m^2/g$ or more and a mean particle size of 1.8 μm or less (preferable 600 nm or less); and Japanese Unexamined Patent Publication No. 2000-302543 describes a translucent material, which is a sintered body with a garnet structure to be used in an arc tube of a discharge lamp, that has a surface roughness (Ra) of 1 μm or less and a porosity of 1% or less, and characteristically the crystal particle size thereof is 30 μm or less. However, the technique of space filling is not described at all in this patent literature.

Well-known inventions related to solid lasers include: a description of a solid laser system in which a GaN group semiconductor laser is used, a rare earth (praseodymium, Pr) excites the solid laser material, and the laser is made to oscillate in the wavelength bands of blue (465 to 495 nm), green (515 to 555 nm), and red (600 to 660 nm) (Japanese Unexamined Patent Publication No. 11(1999)-017266), and a co-doping system comprising Pr is also permitted in the solid laser material in Japanese Unexamined Patent Publication No. 11(1999)-017266; a laser diode excitation solid laser with a SHG wavelength conversion element mounted in the system that takes the final oscillation wavelength band as the ultraviolet region (Japanese Unexamined Patent Publication Nos. 2001-036175 and 2001-036176); an ultraviolet laser apparatus that arranges non-linear optical crystals having a cyclic domain inversion structure in a laser co-oscillator system (Japanese Unexamined Patent Publication No. 2001-185795); a color laser display that applies the aforementioned solid laser element to a display (U.S. Pat. No. 6,764,183,); an emission apparatus that takes a GaN group semiconductor as the activation layer and that causes a garnet group luminescent body activated by a rare earth to emit light by one dimensionally and 2 dimensionally lining up a plurality of emission regions of a broad area (Japanese Unexamined Patent Publication No. 2002-009402); and a laser diode excitation solid laser that is a GaN group semiconductor laser, and that causes visible light, the main light to be oscillated, and light of the ultraviolet region, through a wavelength conversion element, to be oscillated by exciting solid laser material doped with at least one type of ion of rare earth holmium (Ho), or samarium (Sm), or europium (Eu), or dysprosium (Dy), or erbium (Er), or terbium (Tb) (Japanese Unexamined Patent Publication Nos. 2002-344049 and 2002-353542). Moreover, described in European Patent Application Publication No. 1 162 705 is the invention of a diode excitation laser characterized by a system that integrates a solid laser and a laser diode that oscillates at a wavelength from 340 nm to 640 nm, and light with a wavelength from 400 nm to 700 nm is oscillated from the solid material. However, Japanese Unexamined Patent Publication Nos. 11(1999)-017266, 2001-036175, 2001-036176 and 2001-185795, U.S. Pat. No. 6,764,183, Japanese Unexamined Patent Publication Nos. 2002-009402, 2002-344049 and 2002-353542, and European Patent Application Publication No. 1 162 705 are all patents describing the configuration of a simple solid laser, and do not discuss particular techniques for solid laser materials.

Regarding semiconductor laser excitation solid laser systems, there are: Japanese Unexamined Patent Publication No. 5(1993)-090693 that relates to a up-conversion laser having a matrix of (Sr, Ca) (La, Gd)$AlO_4$ group crystals; U.S. Pat. No. 5,070,507 that relates to a Ho doped solid laser that is excited by a wavelength of the 1.1 μm band, and oscillates at a wavelength of the 3 μm band; and Japanese Unexamined Patent Publication Nos. 7(1995)-315992, 8(1996)-012498 and 8(1996)-059397 that relate to solid laser crystal materials that cause a laser of the 1.5 to 2.2 μm band, which is an eye-safe wavelength band, to oscillate using $LiYF_4$ group crystals, and $YAlO_3$ group crystals, using garnet group crystals with a wavelength in the 0.98 to 1.05 μm band, and using $LiYF_4$ crystals, and $YAlO_3$ crystals and garnet group crystals with wavelengths in the 0.98 to 1.04 μm band. However, the object of these inventions differ from that of the present invention.

Meanwhile, regarding white light sources with multi-wavelength output obtained by exciting luminescent bodies with LEDs, well-known inventions include: Japanese Unexamined Patent Publication Nos. 10(1998)-242513 and 11(1999)-243232, International Patent Publication No. WO/98/005078, Japanese Unexamined Patent Publication Nos. 2002-198573, 2002-335010, 2003-101081 and 2003-179259, as well as Japanese Unexamined Patent Publication No. 2001-192655, U.S. Pat. No. 6,642,652, Japanese Unexamined Patent Publication Nos. 2002-232002, 2002-317177 and 2003-105336, and U.S. Patent Application Publication No. 20040145308. However, the majority of these inventions are of the form that the luminescent body to be excited by the LED is impregnated with resin as the microparticle, which differs from the present invention that uses a sintered body of uniform microparticles, and on this point the aforementioned patent literature is different from the present invention.

DISCLOSURE OF THE INVENTION

As described above, there is no prior art that obtains a high precision translucent ceramic sintered body by suitably filling space arrays using single multifaceted microparticles like those of the present invention. Moreover, because there have been no descriptions of using this kind of sintered body in solid laser light emitting media for LED light emitting devices or semiconductor laser (LD) excitation solid lasers, nor any descriptions of using this kind of multifaceted space filled type ceramic sintered body as optical material such as optical lens material, the present invention is a new proposal.

Specifically, objects of the present invention are to provide a translucent material with a high filled space percentage and superior in transparency with little optical scattering, and to provide a production method for this kind of translucent material.

The translucent material of the present invention is a ceramic sintered body, and the micro-structure constituting the aforementioned ceramic sintered body comprises a particle phase consisting of a plurality of particles of a single composition with a monocrystal structure of the same size and the same shape, and a grain boundary phase that is produced at the boundary surfaces where the aforementioned particles contact each other.

The aforementioned particles preferably are any of a cube, a truncated octahedron, or a diamond dodecahedron (also called a rhombic dodecahedron). The aforementioned particles are synthesized by a liquid phase method, and in particular, hydrothermal synthesis or a supercritical reaction is preferable. Here, supercritical reaction means a reaction of a form in which a substance that has undergone under high temperature and high pressure has both the solubility that a liquid has and the dispersion that a gas has.

Letting the diffraction modulus of the aforementioned particle phase be Ng, and the diffraction modulus of the aforementioned grain boundary phase be Nb, preferably, the translucent material of the present invention is (Ng-Nb)/Ng<0.1.

Preferably, the crystal structure of the aforementioned particle is any of a garnet structure, C-rare earth structure, $A_2SiO_5$ structure, perovskite structure, or $GdFeO_3$ structure. Here, the garnet structure is represented by the general formula $A_3B_2C_3O_{12}$, wherein A means an 8-coordinate site, B a 6-coordinate site, and C a 4-coordinate site. A is at least one type selected from Y or a lanthanoid rare earth; B is at least one type selected from Al, Sc, Ga or a lanthanoid rare earth; and C is least one type selected from Al, Ga, Si, or Ge. The C-rare earth structure is represented by the general formula $A_2O_3$, wherein A is at least one type selected from Y, Lu, Sc, or Gd. In the $A_2SiO_5$ structure, A is at least one type selected from Y, Lu, Sc, or Gd.

At least one type selected from a lanthanoid rare earth (La, Ce, Pr, Nd, Sm, Eu, Gd, Tb, Dy, Ho, Er, Tm, Yb, Lu), Cr, Ti, or V is preferably comprised in the aforementioned crystal structure, and more preferably, at least one type selected from Pr, Ho, Sm, Eu, Dy, Er, Tb, Ce, or Gd is comprised.

Preferably, the emission wavelength band of the translucent material of the present invention is in the range from 450 nm to 700 nm, and preferably there is an absorption band in the wavelength band region of wavelengths from 355 nm to 485 nm.

Preferably, the range of the lattice constant of the aforementioned garnet structure is from 1.18 nm to 1.32 nm. Moreover, preferably, the 4-coordinate metal of the structure of aforementioned garnet is Ga, and the 6-coordinate metal is at least one type selected from Sc, Ga, Lu, Yb, Tm, Er, or Ho.

Preferably, the aforementioned grain boundary phase comprises at least one type or more selected from a group consisting of yttrium oxide, aluminum oxide, silicon oxide, yttrium-silicon complex oxide, aluminum-silicon complex oxide, and a compound having a garnet structure with a lower melting point than the aforementioned particles. Specifically, preferably the grain boundary phase comprises at least one type or more selected from $Al_2O_3$ or a compound having a garnet structure with a lower melting point than said particle.

Preferably, the translucent material of the present invention is used as a ceramic material that oscillates by excitation by a GaN group (AlGaN—InGaNAs), ZnSSe group or ZnO group ZnO group semiconductor light emitting diode; or is used as a light-emitting ceramic material that adjusts the color tone of a GaN group (AlGaN—InGaNAs), ZnSSe group or ZnO group semiconductor light emitting diode based on excitation by light emitted from the aforementioned semiconductor diode.

The translucent material of the present invention is a ceramic sintered body, and the micro-structure constituting the aforementioned ceramic sintered body is space filled with polyhedron particles of a single composition with a monocrystal structure of the same size and same shape.

More preferably, the translucent material of the present invention is manufactured by sintering activated particles, in which amorphous fine particles synthesized by a liquid phase method are adhered to the surfaces of the aforementioned particles synthesized by a liquid phase method.

For example, preferably, the translucent material of the present invention is manufactured by synthesizing the aforementioned particles by liquid phase synthesis, and then by sintering activated particles, in which a solution comprising a grain boundary phase composition consisting of at least one or more types selected from $Al_2O_3$ or garnet structures with a lower melting point than the aforementioned particles, or a solution comprising a precipitate is adhered to and grown on the surfaces of the aforementioned particles.

Preferably, at least one of the outer surfaces of the aforementioned translucent material is substantially parallel to either the (100) surface, or the (111) surface or (110) surface of the particle crystal structure.

The manufacturing method of the translucent material of the present invention is a translucent material manufacturing method in which the micro-structure constituting the aforementioned ceramic sintered body comprises a particle phase consisting of a plurality of particles of a single composition with a monocrystal structure of the same size and the same shape, and a grain boundary phase that is produced at the boundary surfaces where the aforementioned particles contact each other; and is characterized in that microparticles are sintered in which amorphous fine particles manufactured by a separate liquid phase synthesis are adhered to the surface of the aforementioned particles synthesized by a liquid phase method.

The manufacturing method of the translucent material of the present invention is a translucent material manufacturing method in which the micro-structure constituting the aforementioned ceramic sintered body comprises a particle phase consisting of a plurality of particles of a single composition with a monocrystal structure of the same size and the same shape, and a grain boundary phase that is produced at the boundary surfaces where the aforementioned particles contact each other; and is characterized in that, after synthesizing said particles by liquid phase synthesis, microparticles are sintered in which a solution comprising a grain boundary phase composition consisting of at least one or more types selected from a group consisting of $Al_2O_3$, yttrium oxide, silicon oxide, yttrium-silicon complex oxide, aluminum-silicon complex oxide, and a compound having a garnet structure with a lower melting point than the aforementioned particles, or a solution comprising a precipitate is adhered to and grown on the surfaces of said particles.

Because the translucent material of the present invention is a translucent material in which the micro-structure constituting this ceramic sintered body comprises a particle phase consisting of a plurality of particles of a single composition with a monocrystal structure of the same size and the same shape, and a grain boundary phase that is produced at the boundary surfaces where the aforementioned particles contact each other, microparticles of a single composition can be arranged and filled in the space at high density to make a translucent material with superior light transmittance and little optical scattering.

Specifically, a high-density space filled translucent material can be made by making the particles be any of a cube, a truncated octahedron, or a diamond dodecahedron. Moreover, if the particles are synthesized by a liquid phase method, specifically, by hydrothermal synthesis or supercritical reaction, the size and shape of the particles become extremely uniform, enabling a more highly dense space filled translucent material to be made.

By establishing (Ng-Nb)/Ng<0.1 when letting the diffraction modulus of the particle phase be Ng, and the diffraction modulus of the grain boundary phase be Nb, a translucent material with even more superior light transmittance can be made.

Consequently, the translucent material of the present invention is useful as a ceramic material that oscillates by excitation by a GaN group (AlGaN—InGaNAs), ZnSSe group or ZnO group semiconductor laser; or as a light-emitting ceramic material that adjusts the color tone of a GaN group (AlGaN—InGaNAs), ZnSSe group or ZnO group semiconductor light-emitting diode based on excitation by light emitted from this semiconductor diode.

It is difficult to say that crystal particles obtained by hydrothermal synthesis or a supercritical reaction are generally active in relation to sintering, and highly dense sintered body cannot be obtained just by sintering these particles. This is because atoms are already positioned in the crystal, which is the most settled site, and therefore it is difficult to produce atomic scattering during sintering, and as a result sintering is difficult to produce between particle and particle.

However, the translucent material manufacturing method of the present invention causes adhesion of amorphous fine particles manufactured by a separate liquid phase synthesis onto the surfaces of particles synthesized by a liquid phase method, and sinters microparticles in a highly reactive state, and therefore, the production of gaps in the finished sintered body can be effectively suppressed, and sintering can be promoted.

BEST MODE FOR CARRYING OUT THE INVENTION

The translucent material of the present invention is a ceramic sintered body, and is characterized in that the microstructure constituting this ceramic sintered body comprises a particle phase consisting of a plurality of particles of a single composition with a monocrystal structure of the same size and the same shape, and a grain boundary phase that is produced at the boundary surfaces where the aforementioned particles contact each other.

Figure 1:
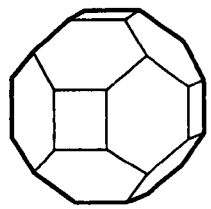
FIG. 1 is a perspective view indicating truncated octahedron particles.
Figure 2:
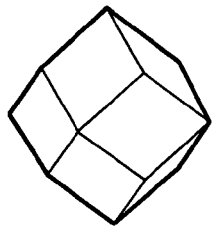
FIG. 2 is a perspective view indicating diamond dodecahedron particles.
Figure 3:
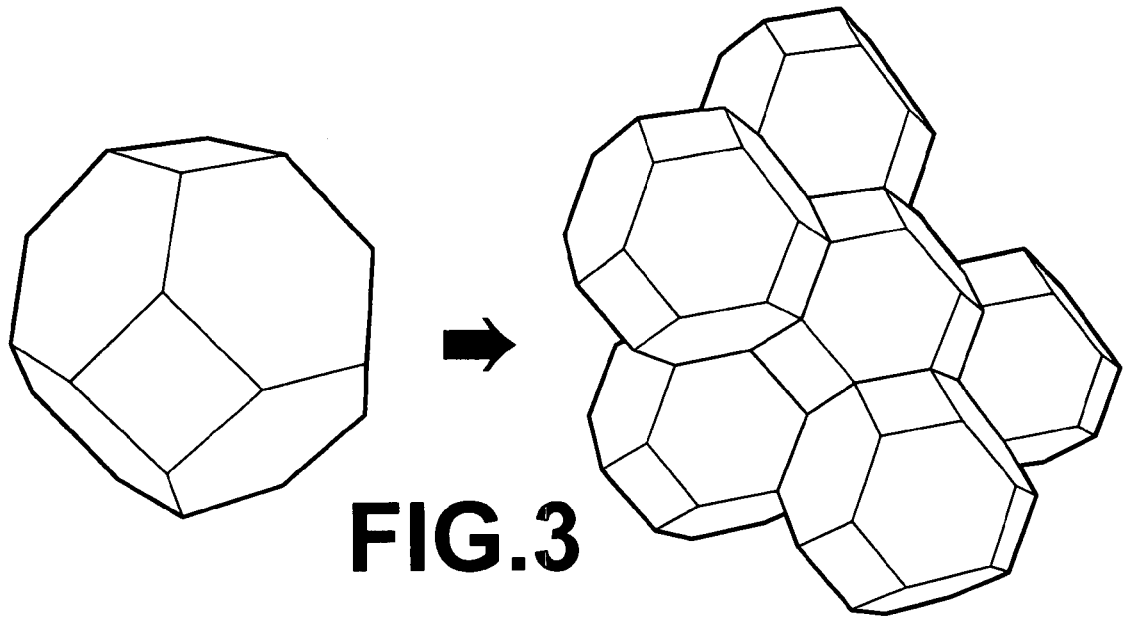
FIG. 3 is an image diagram of space filling without gaps using a plurality of truncated octahedron particles.
Figure 4A:
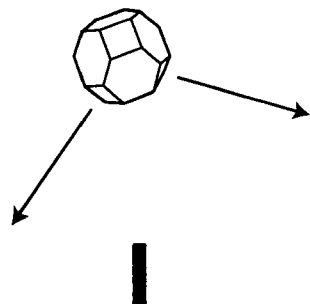
FIG. 4A is a diagram indicating the process of truncated octahedron particles filling up space.
Figure 4B:
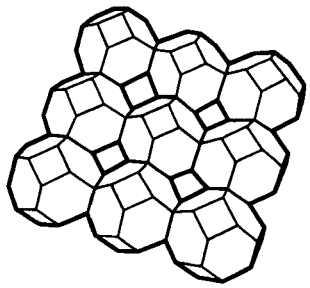
FIG. 4B is a diagram indicating the process of truncated octahedron particles filling up space.
Figure 4C:
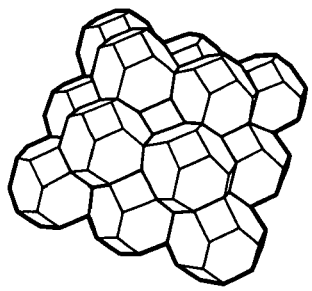
FIG. 4C is a diagram indicating the process of truncated octahedron particles filling up space.
Figure 4D:
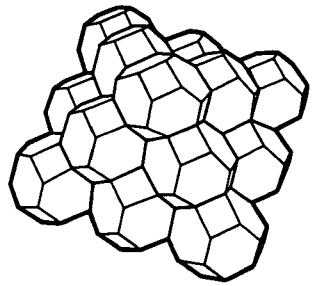
FIG. 4D is a diagram indicating the process of truncated octahedron particles filling up space.

Preferably, the particles are any of cubes, truncated octahedrons or diamond dodecahedrons. Here, FIGS. 1 and 2 indicate truncated octahedron and diamond dodecahedron shapes respectively; and FIG. 3 indicates an image diagram of space filling without gaps using a plurality of truncated octahedron particles. As demonstrated in FIG. 3, when the particles have this kind of shape, the particles can be filled without gats, and a translucent material with a high filled space percentage can be obtained.

FIG. 4 is a diagram indicating the process of truncated octahedron particles filling up a space. As indicated in FIG. 4A, a subsequent particle is aligned in the direction of the arrow taking the truncated front surface of one particle as the contact surface; and the first layer is formed as indicated in FIG. 4B. Next a second layer of particles are aligned in the cavities between the particles indicated in FIG. 4B. Continuing, a third layer of particles on top of the second layer is aligned in the same coordinate positions as the particles of the first layer as indicated in FIG. 4C. The translucent material prior to sintering with the spaces filled in this way without gaps is completed (FIG. 4D).

The translucent material of the present invention can be manufactured by sintering activated particles, in which amorphous particles manufactured by a separate liquid phase synthesis are made to adhere to the surface of particles synthesized by a liquid phase method.

In order to manufacture particles by liquid phase synthesis the elements comprising the raw materials thereof must be made soluble. For that reason, hydrolysis products of compounds comprising these elements or salts of these elements are used. In order to obtain hydrolysis products, various salts are dissolved in water, or hydrolysis is conducted using an alkali aqueous solution such as LiOH aqueous solution, NaOH aqueous solution, KOH aqueous solution, $NH_3$ aqueous solution, $(C_nH_{2n+1})_4NOH$ aqueous solution and the like. Nitrate salt, oxygen acid salt such as sulfate salt, and organic acid salt such as citrate salt, and the like may be cited as the above salts. A substance in which hydroxides of alkali metals such as Li, Na and K are made into aqueous solutions are used as the alkali solutions to dissolve the previously described raw materials.

Because of differences depending on the raw material, it is difficult to generalize, but the reaction temperature is preferably 280° C. or more. The upper limit of the reaction temperature is not particularly limited, but considering the critical steam pressure of the reaction system, about 370° C. is preferable. After the reaction has finished, the particles are obtained as a precipitate, and therefore, are cleaned by decantation using cold or hot water, by centripetal separation, or by filtering. After cleaning, the removed particles are mixed in a suitable medium without drying. Preferably, ethanol, polyvinyl butyral, methylethyl ketone, acetone, or siloxane and the like are used as the medium.

The microparticles are manufactured by making amorphous fine particles manufactured by a separate liquid phase synthesis adhere to the surfaces of the particles synthesized by a liquid phase method as described above. Preferably, the raw material of the amorphous particles is at least one or more kinds selected from $Al_2O_3$ or garnet structure with a lower melting point than that of the particles. Preferably, the amorphous fine particles synthesized by a liquid phase method are as much as possible adhered to a uniform thickness on the particle surface.

Regarding the microparticles, in addition to amorphous fine particles being adhered to the particle surface, substance in which alkoxides of raw material elements are hydrolyzed or substances in which oxalate salt, citrate salt, β-diketone metal complex or dipivaloyl methane (DPM) metal complex is hydrolyzed may also be adhered to the particle surface.

For example, the microparticles may be manufactured by synthesizing particles by liquid phase synthesis, and then, without drying these particles, replacing the solution after synthesis with a solution comprising a grain boundary phase composition consisting of at least one or more types selected from a group consisting of $Al_2O_3$, yttrium oxide, silicon oxide, yttrium-silicon complex oxide, aluminum-silicon complex oxide, and a compound having a garnet structure with a lower melting point than the aforementioned particles, or a solution comprising a precipitate, and the solution containing the grain boundary phase or the solution containing the precipitate is made to adhere to and grow on the particle surfaces.

This mixed solution is poured into a container having smooth finished bottom, and the microparticles in the mixed solution are allowed to slowly settle and align 3-dimensionally to make a molded body. A 3-dimensionally aligned molded body like that indicated in FIG. 4 can be obtained as time passes. By sintering this molded body, an optically transparent translucent material of the present invention with exceedingly uniform granularity and extremely little scattering can be obtained by sintering this molded body.

Well-known sintering methods include: press sintering in which the molded body is generally formed into a film shape under high pressure using a single screw press or a cold isostatic pressing, and then is sintered at high temperature; hot isostatic pressing (HIP), in which processing to apply high temperatures of several 100° C. and isostatic press form several tens to several hundreds MPa are simultaneously conducted on the molded body; and hot pressing or vacuum sintering that press the molded body by applying to high temperatures of several 100° C. and applying pressure only in the axial direction. These sintering methods may be used in the manufacturing method of the translucent material of the present invention, but because the molded body of the present invention is a structure in which the particles are densely filled with an extremely uniform granularity, even if large pressure is not applied, an optically transparent translucent material can be obtained with no air holes, with uniform granularity and with extremely little scattering. Consequently, even without vacuum sintering, an effect may be anticipated using ordinary sintering under atmospheric pressure. In this case, the manufacturing costs when sintering can be reduced.

Preferably, the micro-structure constituting the ceramic sintered body of the translucent material of the present invention is space filled with polyhedron particles of a single composition with a monocrystal structure of the same size and same shape. Specifically, preferably the grain boundary phase has substantially no grain boundary under the limits of detection by transmission electron microscope (TEM). If the translucent material has substantially no grain boundary phase, it is possible to suppress light scattering and absorbance to extremely small levels.

Figure 5:
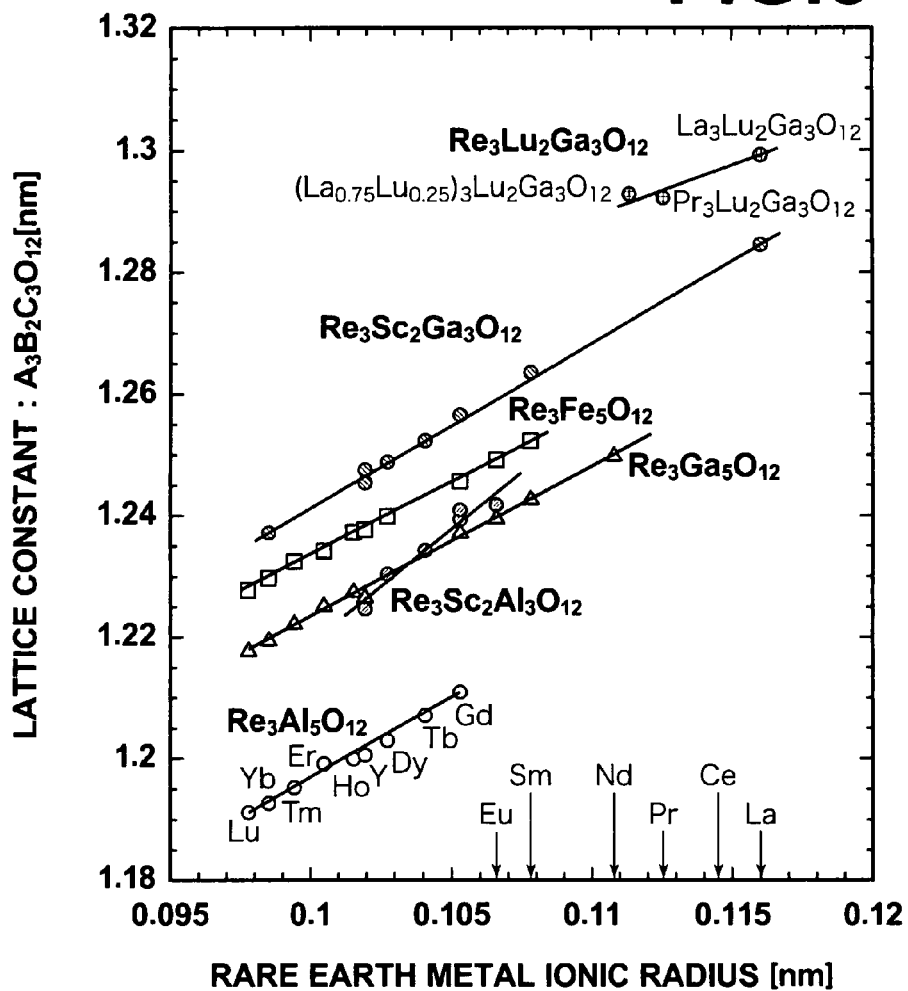
FIG. 5 is a graph indicating the correlation of the lattice constant and the rare earth ionic radius of a rare earth garnet crystal.

FIG. 5 indicates the correlation of rare earth ionic radii and the lattice constant of a garnet structure configured by these rare earths ((JCPDS-ICDD Data (PDF-2) data, and J. Cryst. Growth., 20 (1973) 1-5, Phys. Rev. B, (1988) 9126-9139), and the aforementioned liquid phase synthesis is theoretically possible for all these systems; and the range of the lattice constant values of the garnet structures are preferably from 1.18 nm to 1.32 nm.

When providing translucent material with light emission characteristics, at least one type of light emitting species selected from lanthanoid rare earths, Cr, Ti, and V is mixed in a specific mol concentration at the stage of hydrothermal synthesis of the particle phase, and if suitable conditions are designed, it is possible to easily synthesize doped microparticles.

Examples of manufacturing a translucent material of the present invention are indicated below.

EXAMPLES

Example 1

17.237 g of yttrium nitrate [$Y(NO_3)_3 \cdot 6H_2O$] and 28.133 g of aluminum nitrate [$Al(NO_3)_3 \cdot 9H_2O$] respectively were precisely weighed, and dissolved in approximately 40 ml of water in a beaker. Meanwhile, about 20 g of KOH granules were weighed in a separate beaker making a total of about 30 to 40 ml, and this was gradually added while agitating into the aqueous solution containing the yttrium and aluminum. Then, KOH granules were suitably added to make the pH 12.0, and the total amount of solution was brought to 100 ml. This raw material aqueous solution was placed in an autoclave made of Hastelloy, and was allowed to react at 355° C. for 2 hours while agitating in an agitation apparatus that had undergone platinum lining processing.

After the reaction, the internal solution is moved to a beaker, and a decantation process that eliminates just the supernatant part is conducted 10 or more times with hot water, and finally the reaction precipitate is filtered. Part of this filtered reaction precipitate is made into a powder by drying, and when confirming the X-ray diffraction pattern of this powder using an X-ray analysis apparatus (RINT-ULTIMA+: manufactured by Rigaku Denki), the powder very closely agreed with PDF#33-0040 listed in the JCPDS-ICDD data, and was confirmed to be YAG particle single phase. Moreover, when observing the particle shape using a scanning electron microscope (SEM), the YAG particles obtained from this reaction were diamond (rhombic) dodecahedron shaped with an extremely high uniform granularity.

Ethanol was mixed in the precipitate other than that used for analysis (particles not dried) to make a mixed solution. The mixed solution was poured in a container with a bottom having an extremely smooth finish, and the particles were allowed to slowly settle. Next, the supernatant was gently wiped off, and this was allowed to dry undisturbed to make a pancake-shaped substance. A sintered body was obtained by sintering this in a box-shaped electric furnace at 1750° C. for 5 hours in air. Both sides of the ceramic sintered body obtained were mirror polished, and a transparent ceramic sintered body was obtained. It was confirmed by SEM observation that the particles configuring the ceramic sintered body came from hydrothermal synthetic particles and formed an extremely uniform space filled structure with no grain barrier phase.

Example 2

An aqueous solution of equal concentrations of yttrium, aluminum and KOH alkali adjusted in advance for hydrothermal synthesis was used, and was added to fine crystalline particles prepared by the same hydrothermal synthesis as example 1. At this time, the mol ratio of fine crystalline particles and the added aqueous solution (amount of YAG raw material mixed in) converted to YAG was pre-adjusted to about 100:1. The solution prepared in this way was again allowed to react for 1 hour at 250° C. in an autoclave. After removing from the autoclave and conducting decantation 10 times or more, this was made into a mixed solution by mixing together with a dispersion medium in the same way as in example 1, and was poured in a container with a bottom having an extremely smooth finish, and the particles were allowed to slowly settle.

Next, the supernatant was gently wiped off, and this was allowed to dry undisturbed to make a pancake-shaped substance. A sintered body was obtained by sintering this in a box-shaped electric furnace at 1700° C. for 20 hours in air. When confirming the sintered body obtained using an X-ray analysis apparatus, a slight amount of unreacted YAG amorphous phase was adhered to the surface of the YAG crystals. Both sides of the ceramic sintered body obtained were mirror polished and a transparent ceramic sintered body was obtained. The XRDP of the surface of the sintered body after polishing was well positioned at the PDF#33-0040 pattern, and YAG single phase was confirmed. Moreover, it was confirmed by SEM observations that the particles configuring the ceramic sintered body came form hydrothermal synthetic particles and an extremely uniform space filled structure was formed.

Example 3

17.237 g of yttrium nitrate [$Y(NO_3)_3 \cdot 6H_2O$] and 28.133 g of aluminum nitrate [$Al(NO_3)_3 \cdot 9H_2O$] respectively were precisely weighed, and dissolved in approximately 40 ml of water in a beaker. Meanwhile, about 20 g of KOH granules were weighed in a separate beaker making a total of about 30 to 40 ml, and this was gradually added while agitating into the aqueous solution containing the yttrium and aluminum. Then, KOH granules were suitably added to make the pH 11.5, and the total amount of solution was brought to 100 ml. This raw material aqueous solution was placed in an autoclave made of Hastelloy, and was allowed to react at 300° C. for 30 minutes while agitating in an agitation apparatus that had undergone platinum lining processing.

After the reaction, the internal solution is moved to a beaker, and a decantation process that eliminates just the supernatant part is conducted 10 or times with hot water, and finally the reaction precipitate is filtered. Part of this filtered reaction precipitate is made into a powder by drying, and when confirming the X-ray diffraction pattern of this powder using an X-ray analysis apparatus, the powder very closely agreed with PDF#33-0040 listed in the JCPDS-ICDD data, and was confirmed to be YAG particle single phase. Moreover, when observing the particle shape using a scanning electron microscope (SEM), the YAG particles obtained from this reaction were truncated octahedron-shaped with an extremely high uniform granularity.

Polyvinyl butyral was mixed in the precipitate other than that used for analysis to make a mixed solution. The mixed solution was poured in a container with a bottom having an extremely smooth finish, and the microparticles were allowed to slowly settle. Next, the supernatant was gently wiped off, and this was allowed to dry undisturbed to make a pancake-shaped substance. A sintered body was obtained by sintering this in a box-shaped electric furnace at 1750° C. for 5 hours in air. Both sides of the ceramic sintered body obtained were mirror polished, and a transparent ceramic sintered body was obtained. It was confirmed by SEM observations that the particles configuring the ceramic sintered body came from hydrothermal synthetic particles and formed an extremely uniform space filled structure.

Figure 6:
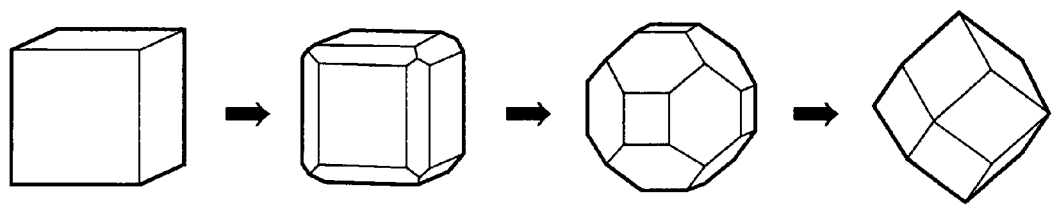
FIG. 6 is the change of crystal facet based on reaction time.
Figure 7:
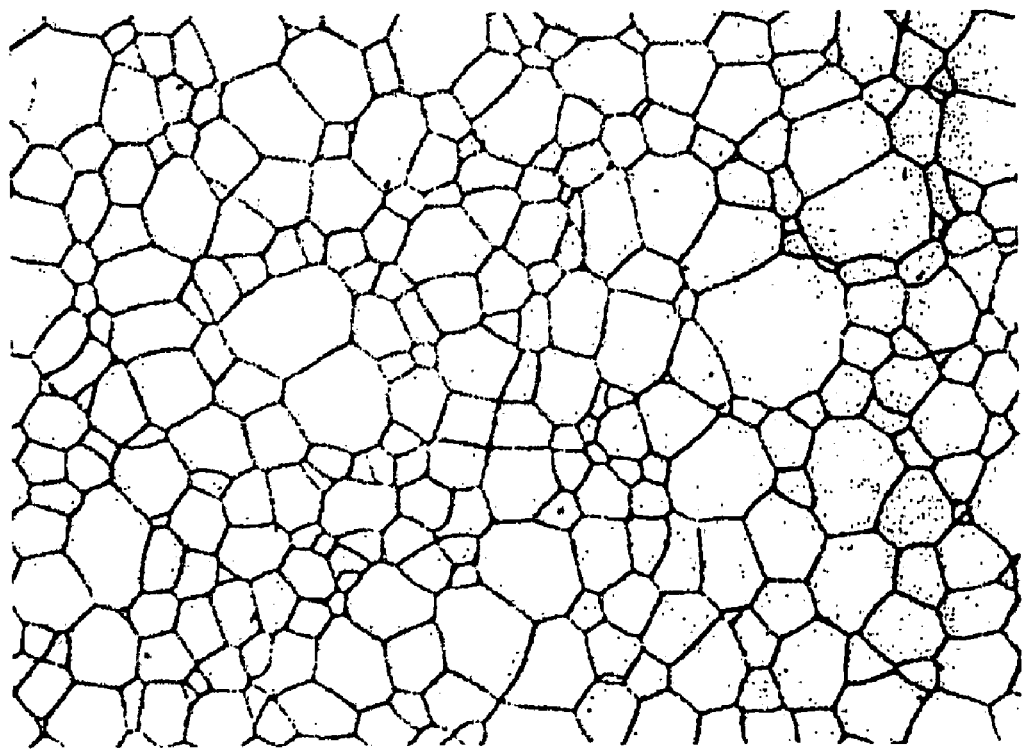
FIG. 7 is a schematic diagram of a SEM photograph of a conventional YAG ceramic sintered body.

The YAG particles obtained in example 1 above were diamond dodecahedron-shaped, and the YAG particles obtained in example 3 were truncated octahedron-shaped, and in regard to the shape of the grain size, it appears that the appearance of the microparticles change with the reaction time as indicated in FIG. 6. Consequently, it is possible to adjust the shape of the particles by controlling the reaction time.

Further, in the examples above, the activated particles were manufactured by a method of allowing amorphous fine particles immediately prior to crystallization adhere to the crystal nucleus barrier surface of particles in the same reaction solution, but, for example, the activated particles may be manufactured by a method of hydrolyzing yttrium and aluminum alkoxides, and allowing this to adhere to the crystal nucleus barrier surface of the particles.

Moreover, in the examples above, YAG was described, but this reaction may also apply to a garnet structure, C-rare earth structure, $A_2SiO_5$ structure, perovskite structure, or $GdFeO_3$ structure.

The invention claimed is:

1. A translucent material that is a ceramic sintered body, characterized in that the micro-structure constituting said ceramic sintered body comprises
    a particle phase consisting of a plurality of particles of a single composition with a monocrystal structure of a uniform size and a uniform shape; and
    a grain boundary phase that is produced at boundary surfaces where said particles contact each other,
    wherein said grain boundary phase comprises at least one type or more selected from the group consisting of yttrium oxide, aluminum oxide, yttrium-silicon complex oxide, aluminum-silicon complex oxide, and a compound having a garnet structure with a lower melting point than said particle;
    wherein said plurality of particles comprise any of a cube, a truncated octahedron, or a diamond dodecahedron; and
    wherein the crystal structure of said plurality of particles is any of a garnet structure, C-rare earth structure, $A_2SiO_5$-type structure, perovskite structure, or $GdFeO_3$-type structure.

2. The translucent material according to claim 1, wherein said plurality of particles are synthesized by a liquid phase method.

3. The translucent material according to claim 2, wherein said liquid phase method is hydrothermal synthesis or a supercritical reaction.

4. The translucent material according to claim 1, wherein said crystal structure comprises at least one type selected from lanthanoid rare earth, Cr, Ti, and V as a luminescence activated species.

5. The translucent material according to claim 4, wherein said luminescence activated species is at least one type selected from Pr, Ho, Sm, Eu, Dy, Er, Tb, Ce, and Gd.

6. The translucent material according to claim 1, which has an emission wavelength band in the range from 450 nm to 700 nm.

7. The translucent material according to claim 1, which has an absorption band in the wavelength band region of wavelengths from 355 nm to 485 nm.

8. The translucent material according to claim 1, wherein the range of the lattice constant of said garnet structure is from 1.18 nm to 1.32 nm.

9. The translucent material according to claim 1, wherein the 4-coordinate metal of the structure of said garnet is Ga, and the 6-coordinate metal is at least one type selected from Sc, Ga, Lu, Yb, Tm, Er, and Ho.

10. The translucent material according to claim 1, wherein said grain boundary phase comprises at least one type or more selected from $Al_2O_3$ or a compound having a garnet structure with a lower melting point than said particles.

11. The translucent material according to claim 10, which is suitable for use as a ceramic material that oscillates by excitation by a GaN group (AlGaN—InGaNAs), ZnSSe group or ZnO group semiconductor laser.

12. The translucent material according to claim 10, which is suitable for use as a light-emitting ceramic material that adjusts the color tone of a GaN group (AlGaN—InGaNAs), ZnSSe group or ZnO group semiconductor light emitting diode based on excitation by light emitted from said semiconductor diode.

13. A translucent material that is a ceramic sintered body, wherein the micro-structure constituting said ceramic sintered body is space filled with polyhedron particles of a single composition with a monocrystal structure of a uniform size and uniform shape, wherein:
    the shape of said polyhedron particles are any one of a cube, a truncated octahedron, and a diamond dodecahedron; and
    said polyhedron particles align three-dimensionally.

14. The translucent material according to claim 2, which is obtained by sintering activated particles in which amorphous fine particles synthesized by a liquid phase method are adhered to the surfaces of said particles synthesized by a liquid phase method.

15. The translucent material according to claim 2, which is obtained by, after synthesizing said particles by liquid phase synthesis, sintering activated particles in which a solution comprising a grain boundary phase composition consisting of at least one or more types selected from $Al_2O_3$ or garnet structures with a lower melting point than said particles, or a solution comprising a precipitate is adhered to and grown on the surfaces of said particles.

16. The translucent material according to claim 15, wherein said microparticles are made into a 3-dimensional array in a solution and are formed into a molded body, and said molded body is sintered.

17. The translucent material according to claim 1, wherein at least one of the outer surfaces of said translucent material is substantially parallel to either the (100) surface, or the (111) surface or (110) surface of the particle crystal structure.

18. A manufacturing method of a translucent material, wherein the translucent material is a ceramic sintered body and the micro-structure constituting said ceramic sintered body comprises
    a particle phase consisting of a plurality of particles of a single composition with a monocrystal structure of a uniform size and a uniform shape; and
    a grain boundary phase that is produced at boundary surfaces where said particles contact each other;
    said manufacturing method comprising sintering microparticles, in which amorphous fine particles are adhered to the surface of the plurality of particles, wherein the amorphous fine particles are synthesized by a liquid phase method and the plurality of particles are synthesized by a liquid phase method.

19. A manufacturing method of a translucent material, wherein the translucent material is a ceramic sintered body and the micro-structure constituting said ceramic sintered body comprises a particle phase consisting of a plurality of particles of a single composition with a monocrystal structure of a uniform size and a uniform shape; and a grain boundary phase that is produced at boundary surfaces where said particles contact each other, wherein said grain boundary phase comprising at least one type or more selected from the group consisting of yttrium oxide, aluminum oxide, yttrium-silicon complex oxide, aluminum-silicon complex oxide, and a compound having a garnet structure with a lower melting point than said particle, said manufacturing method comprising synthesizing said plurality of particles by liquid phase synthesis, and sintering microparticles, in which a solution comprising the grain boundary phase composition, or a solution comprising a precipitate is adhered to and grow on the surfaces of said particles.

20. The translucent material manufacturing method according to claim 19, wherein said microparticles are made into a 3-dimensional array in a solution and are formed into a molded body, and said molded body is sintered.

* * * * *